(12) United States Patent
Traechtler et al.

(10) Patent No.: US 10,145,924 B2
(45) Date of Patent: Dec. 4, 2018

(54) MAGNETIC RESONANCE IMAGING WITH UNDERSAMPLING

(71) Applicant: Siemens Healthcare GmbH, Erlangen (DE)

(72) Inventors: Julia Traechtler, Karlsruhe (DE); Qiu Wang, Princeton, NJ (US); Boris Mailhe, Plainsboro, NJ (US); Xiao Chen, Somerset, NJ (US); Marcel Dominik Nickel, Herzogenaurach (DE); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 140 days.

(21) Appl. No.: 15/405,449

(22) Filed: Jan. 13, 2017

(65) Prior Publication Data

US 2018/0203085 A1 Jul. 19, 2018

(51) Int. Cl.
*G01R 33/561* (2006.01)
*G01R 33/48* (2006.01)

(52) U.S. Cl.
CPC ..... *G01R 33/5612* (2013.01); *G01R 33/4822* (2013.01)

(58) Field of Classification Search
CPC .................. G01R 33/5612; G01R 33/4822
See application file for complete search history.

(56) References Cited

U.S. PATENT DOCUMENTS

| 6,307,369 B1* | 10/2001 | Felmlee ........... G01R 33/56509 324/307 |
| 9,035,653 B2 | 5/2015 | Hutter et al. |
| 2002/0087068 A1 | 7/2002 | Foo |
| 2010/0277172 A1* | 11/2010 | Takizawa ........... G01R 33/5616 324/309 |
| 2016/0291106 A1 | 10/2016 | Fuderer et al. |

OTHER PUBLICATIONS

Blaimer, M. et al.; Artifact Reduction in undersampled Blade/Propeller MRI by k-space extrapolation using parallel imaging, Proc. Intl. Soc. Mag. Reson. Med. 14 (2006), p. 5.
Propeller/Blade—Questions and Answers in MRI at http://mriquestions.com/propellerblade.html, Dec. 4, 2016.
Chauffert, Nicolas, et al. "Variable density sampling with continuous trajectories." SIAM Journal on Imaging Sciences 7.4 (2014): 1962-1992.

* cited by examiner

*Primary Examiner* — Rodney Bonnette

(57) ABSTRACT

A method for magnetic resonance (MR) imaging is provided. A first sampling mask is provided for sampling along a first set of parallel lines extending in a first direction in k-space. A second sampling mask is provided for sampling along a second set of parallel lines extending in a second direction in k-space. The second direction is orthogonal to the first direction. A first set of MR k-space data is sampled using an MR scanner, by scanning a subject in the first direction using the first sampling mask. A second set of MR k-space data is sampled using the MR scanner, by scanning the subject in the second direction using the second sampling mask. An MR image is reconstructed from a combined set of MR k-space data including the first set of MR k-space data and the second set of MR k-space data.

18 Claims, 21 Drawing Sheets

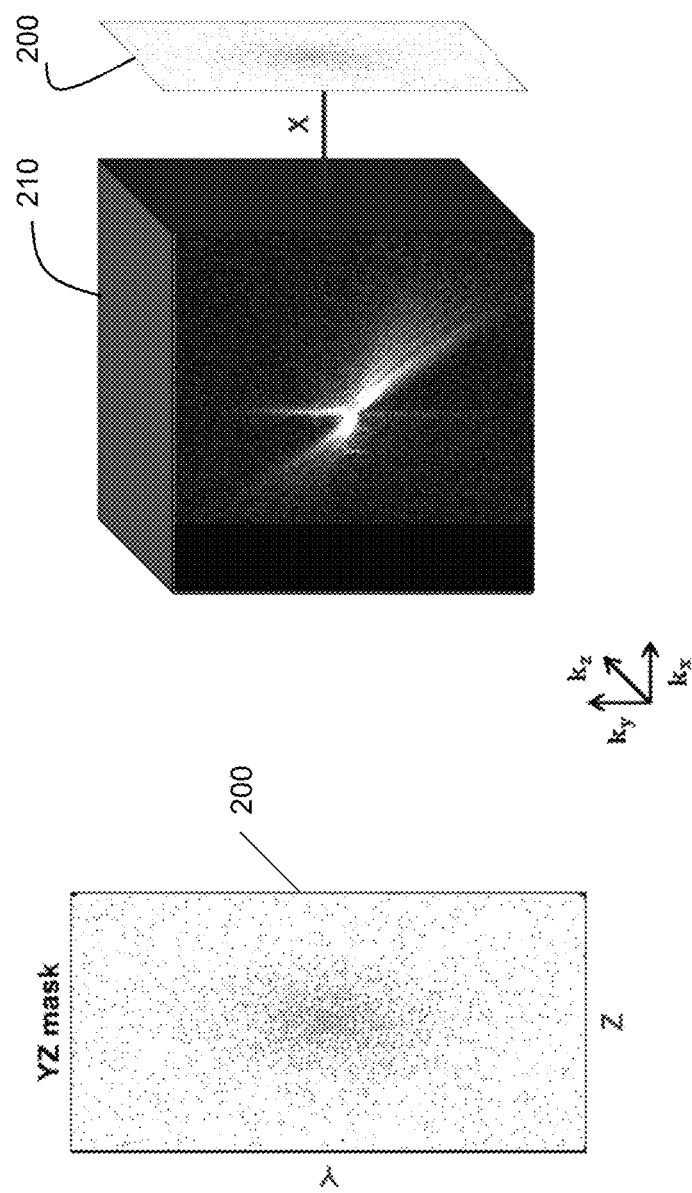

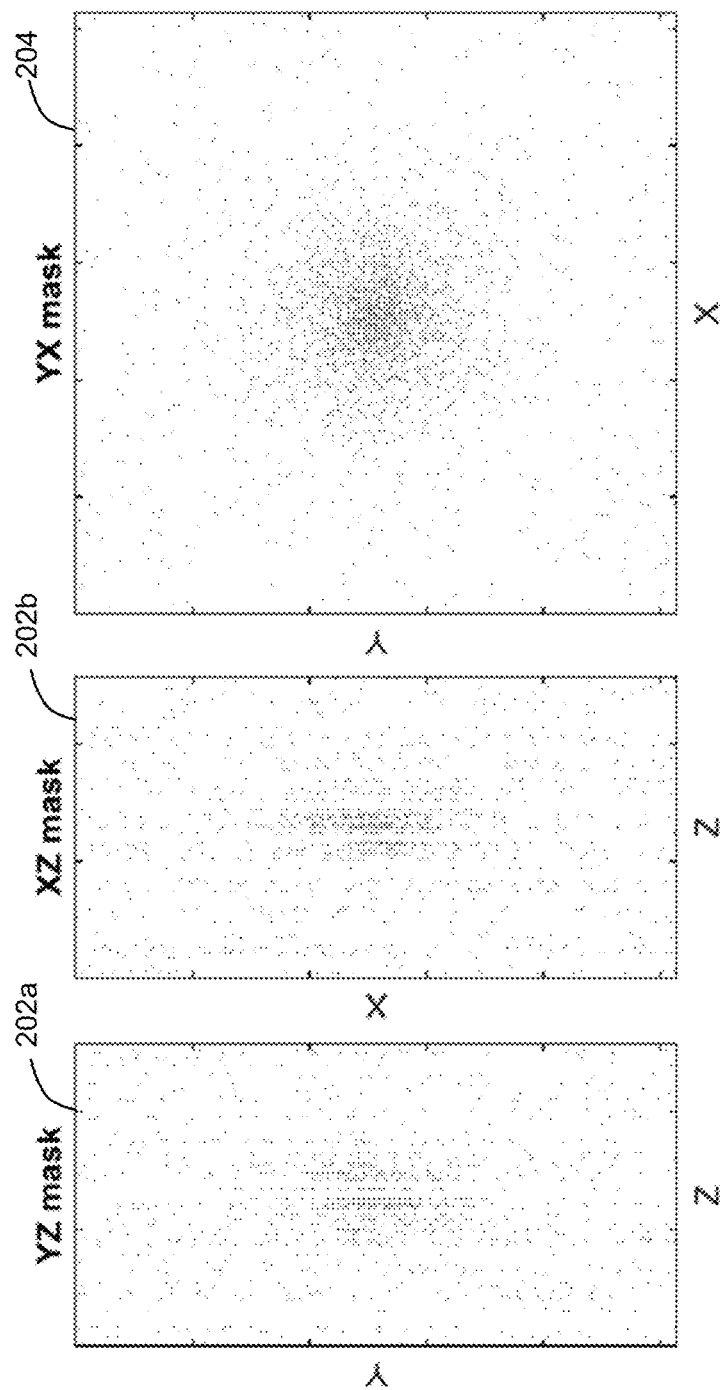

MAGNETIC RESONANCE IMAGING WITH UNDERSAMPLING

FIELD

This disclosure relates generally to magnetic resonance (MR) imaging.

BACKGROUND

In magnetic resonance imaging (MRI), compressed sensing reduces scan time with faster acquisition by measuring fewer Fourier coefficients. This produces a high-quality image with relatively lower scan time. Compressed sensing, in this case, removes the high spatial gradient parts—mainly, image noise and artifacts. For this purpose, random (incoherent) sampling patterns are optimal, so that the noise statistics follows white Gaussian distribution. Compressed Sensing acquisitions fix the physiological direction of the readout line during a single scan, so the readout line is always in one direction, e.g. left-to-right, front-to-back or head-to-feet. Current MRI scanners are able to achieve incoherent sampling pattern up to a limit. The limiting parameter is that the current scan technology acquires readout lines (one dimension in k-space) sequentially one sample after another. Acquisition of one continuous readout line is fast, while skipping samples within a single readout line does not save much acquisition time compared to the time saved for switching to different readout lines. Thus, entire continuous lines of samples are acquired, even if compressed sensing is used. Compressed Sensing acquisition speeds up acquisition time by skipping samples in directions other than the direction of the readout line, e.g. in phase-encoding, partition-encoding or time directions. Since the readout direction is fully sampled coherently, this sampling scheme does not introduce incoherence in the readout direction. Nevertheless, randomly sampling in the readout direction does not save acquisition time.

Non-Cartesian sampling patterns avoid this issue by relaxing the sampling frequency grid. However, non-Cartesian sampling patterns require higher computation time due to the non-uniform fast Fourier Transform (FFT) used during image reconstruction.

SUMMARY

In some embodiments, a method for magnetic resonance imaging comprises: providing a first sampling mask for sampling along a first set of parallel lines extending in a first direction in k-space; providing a second sampling mask for sampling along a second set of parallel lines extending in a second direction in k-space, where the second direction is orthogonal to the first direction; sampling a first set of magnetic resonance (MR) k-space data using an MR scanner by scanning a subject in the first direction using the first sampling mask; sampling a second set of MR k-space data using the MR scanner by scanning the subject in the second direction using the second sampling mask; and reconstructing an MR image from a combined set of MR k-space data including the first set of MR k-space data and the second set of MR k-space data.

In some embodiments, a method for magnetic resonance imaging comprises: providing a two-dimensional (2D) sampling mask having a set of points, where each point has a respective Z coordinate in a space having orthogonal directions X, Y and Z; partitioning a set containing the Z coordinates in the set of points into first and second disjoint subsets; partitioning the 2D mask into a first sampling mask for sampling along a first set of lines extending in the Y direction through points with Z coordinates in the first subset, and a second sampling mask for sampling along a second set of lines extending in the X direction through points with Z coordinates in the second subset; sampling a first set of magnetic resonance (MR) k-space data using an MR scanner by scanning a subject in the X direction using the first sampling mask; sampling a second set of MR k-space data using the MR scanner by scanning the subject in the Y direction using the second sampling mask; and reconstructing an MR image from a combined set of MR k-space data including the first set of MR k-space data and the second set of MR k-space data.

In some embodiments, a method comprises: providing at least one sampling mask for sampling magnetic resonance (MR) k-space data, the sampling mask having three bands, including a center band of the three bands; acquiring a first set of MR k-space data with an MR scanner by scanning a subject in a first direction to acquire data in the center band using a first one of the at least one mask; acquiring a second set of MR k-space data with the MR scanner by scanning the subject in a second direction to acquire data in the center band using a second one of the at least one mask, the second direction orthogonal to the first direction; acquiring a third set of MR k-space data with the MR scanner by scanning the subject in a third direction to acquire data in the center band using a third one of the at least one mask, the third direction orthogonal to the first direction and the second direction; and reconstructing an MR image from a combined set of MR k-space data including the first set of MR k-space data, the second set of MR k-space data, and the third set of MR k-space data In some embodiments, an MRI system comprises: a magnetic resonance (MR) scanner device having a plurality of coils, and configured to collect data representing an MR image from a subject; a processor having a storage device for storing frequency components of the collected data, the processor programmed for: acquiring a first set of MR k-space data using the MR scanner to scan the subject in a first direction using a first sampling mask, including sampling along a plurality of parallel lines extending in the first direction; acquiring a second set of MR k-space data using the MR scanner to scan the subject in the a second direction using a second sampling mask, including sampling along a second plurality of lines extending in the second direction; and reconstructing an MR image from a combined set of MR k-space data including the first set of MR k-space data and the second set of MR k-space data.

BRIEF DESCRIPTION OF THE DRAWINGS

FIG. 2A is a schematic representation of a sampling mask according to some embodiments.

FIG. 2B is a schematic showing the sampling mask of FIG. 2A used to sample MR k-space data while scanning a subject in the X direction.

FIGS. 7A-7C show sampling masks for a 3D scanning method according to some embodiments.

DETAILED DESCRIPTION

Figure 1:
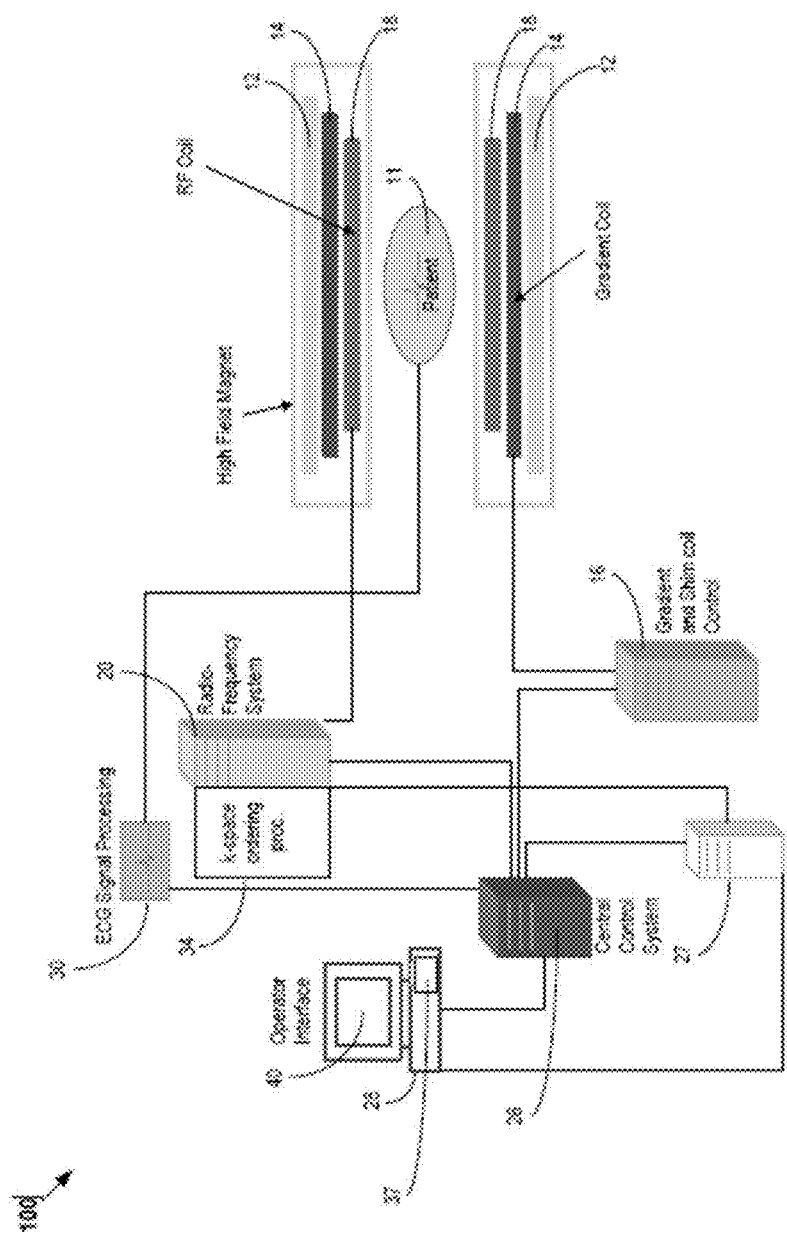
FIG. 1 is a block diagram of an embodiment of an MR system for medical imaging.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

It is desirable to improve MR image quality without increasing scanning time, because it can be difficult for patients to remain still during a prolonged scan.

Sampling patterns according to some embodiments described herein sample each readout line continuously, but the readout lines are not fixed to a single physiological direction. Taking three-dimensional (3D) acquisition as an example, some embodiments of the acquisition method acquire some readout lines in the left-to-right direction, and sample other readout lines in the head-to-feet direction. By switching the readout between the three physiological directions, more incoherence is introduced into the sampled data, leading to better image reconstruction results (with less blurring) compared to a sampling pattern with the same acceleration (undersampling) factor. In some embodiments, the selection of the readout lines to be sampled in each direction is based on a probability density function. Various embodiments achieve optimum readout selection strategy, to approximate the image quality of a theoretically incoherent (random) 3D sampling pattern.

This disclosure describes several embodiments directed at methods, systems, and apparatuses for Magnetic Resonance Imaging (MRI) sampling. The techniques described herein may be combined with many if not all image reconstruction methods to provide an overall image quality improvement without sacrificing performance. U.S. Patent Application Publication No. US2016/0247263 by Mailhe et al. describes use of wavelets for regularization and reconstructing magnetic resonance images, and is incorporated by reference herein in its entirety. U.S. Patent Application Publication No. US2016/0146915 by Mailhe et al. describes a compressed sensing process for reconstructing magnetic resonance images, and is incorporated by reference herein in its entirety.

Compressed Sensing is a technology that speeds up MRI acquisition through acquiring less data, yet recovering the missing samples through image reconstruction. A sampling pattern in MRI acquisition decides which k-space samples to acquire and which to skip. Improving the sampling pattern is important for successful image reconstruction without blurring or artifacts. This disclosure describes sampling pattern generation methods that can provide improved efficiency in compressed sensing for improved image quality. Thus, image quality can be improved without increasing sampling time (or sampling time can be reduced without degrading image quality). The disclosed method can be used with a variety of MRI scanner hardware designs.

Some embodiments described herein use include first and second sampling masks for sampling MR data of a subject in first and second orthogonal directions, respectively, and reconstructing an image from the union of the data sampled using each of the first and second masks. Some embodiments partition a 2 dimensional (2D) sampling mask to provide first and second sampling masks for sampling MR data of a subject in first and second orthogonal directions, respectively, and reconstructing an image from the union of the data sampled using each of the first and second masks. Some embodiments include a third sampling mask for sampling MR data of the subject in the third direction, and reconstructing an image from the union of the data sampled using each of the first, second, and third masks.

System Architecture

FIG. 1 shows a system 100 for ordering acquisition of frequency domain components representing Magnetic Resonance (MR) image data for storage in a k-space storage array, as used by some embodiments. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired using a Cartesian acquisition strategy as the multiple individual frequency components are sequentially acquired during acquisition of an MR dataset representing an MR image. A storage processor in the k-space component processor unit 34 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control processor 26 is programmed to sample the MR signals according to a predetermined sampling pattern. Central control unit 26 also uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

MR scanning system 100 is only exemplary, and a variety of MR scanning systems can be used to collect the MR data.

FIG. 2A shows an example of a YZ sampling mask 200. The sampling mask 200 has a plurality of points, shown as dots. Each point corresponds to the Y and Z coordinates of a sampling line, along which data are acquired as the MR scanner samples in the X direction. In some embodiments, the sampling mask 200 has a variable density of sampling points. The sampling mask is arranged to sample frequencies at a center of a Fourier plane with a greater density of k-space data than frequencies at an edge or corner of the Fourier plane. In some embodiments, the density of the sampling points is greatest at the center of the mask 200 and decreases in every direction relative to the center. For example, the density can vary with distance from the center of the scanning field according to a Gaussian distribution or power law.

FIG. 2B is a schematic diagram showing the mask 200 applied for sampling k-space data in the X direction. The cube 210 is a representation of the 3D k-space data corresponding to an MR image. The luminance at each point in cube 210 represents the amplitude of a corresponding frequency component of the MR signals. The luminance is greatest at the center and is substantially zero at the edges and corners of the cube 210. This indicates that the coefficients of the high frequency components of the image approach zero.

Figure 2C:
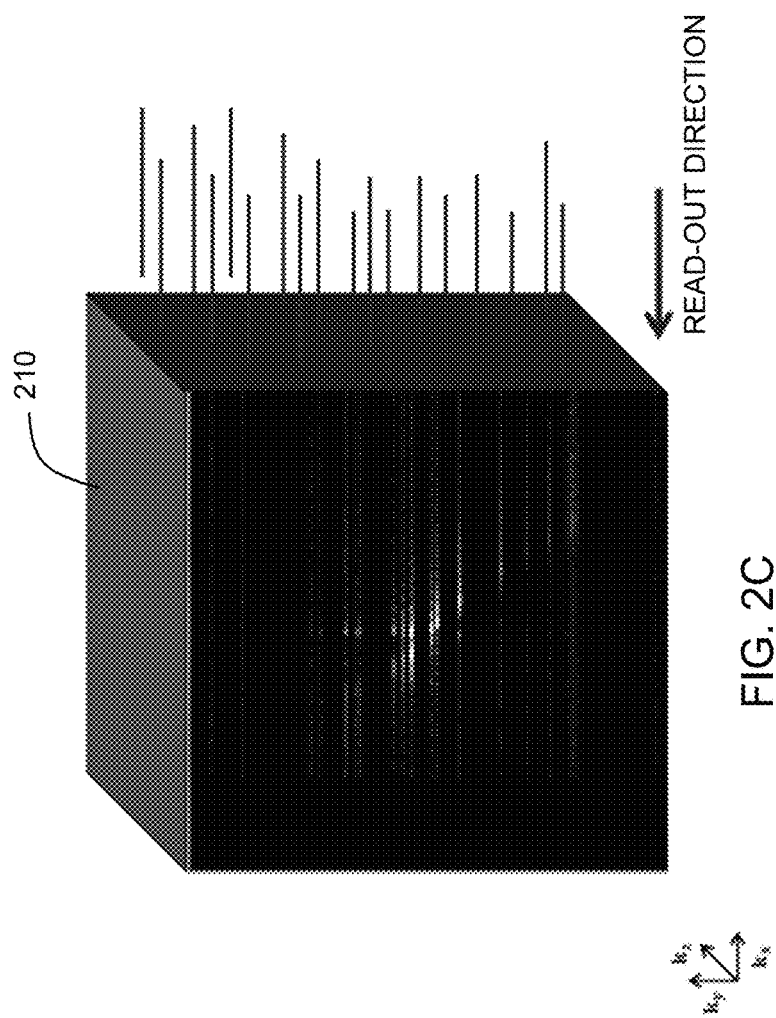
FIG. 2C is a schematic representation of the lines of k-space data sampled by the scan of FIG. 2B.

FIG. 2C is a schematic diagram of the sampling pattern as the MR scanner 100 scans using the sampling mask 200 in the X direction. Each point in the mask 200 sweeps across a respective line as shown in FIG. 2C. The k-space data (represented by luminance in FIG. 2C) are sampled at the locus of points at which each line crosses the k-space. As shown in FIG. 2C, there is a correlation between the values at points sampled along the same line as each other.

2D Sampling

Figures 3A, 3B, 3C:
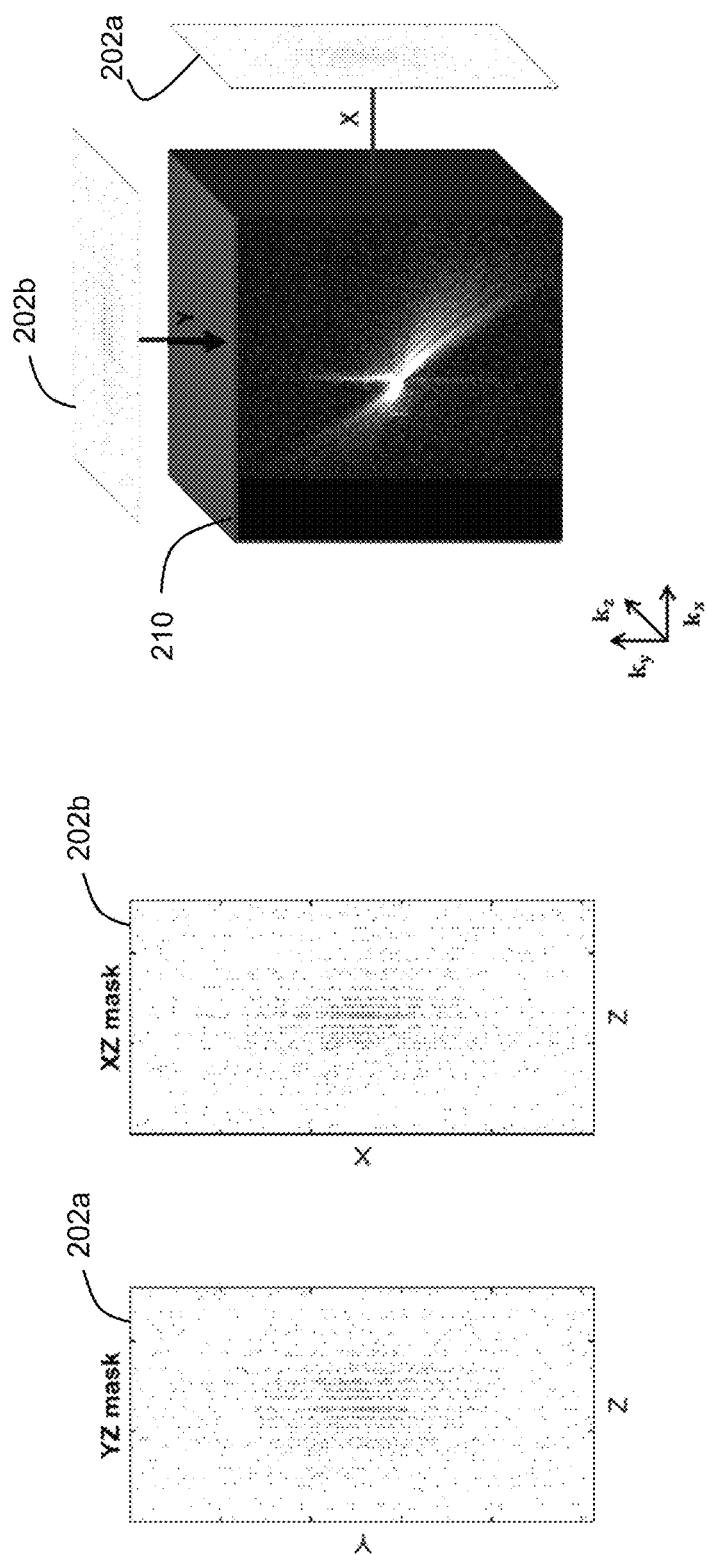
FIGS. 3A and 3B show two sampling masks for sampling in orthogonal directions.
FIG. 3C is a schematic showing the sampling masks of FIGS. 2A and 2B used to sample MR k-space data in while scanning a subject in the X and Y directions, respectively.

FIGS. 3A-3C are schematic diagrams of a 2D scanning method for magnetic resonance imaging. A first sampling mask 202a (FIG. 3A) is provided, for sampling along a first set of parallel lines extending in a first direction in k-space. A second sampling mask 202b (FIG. 3B) is provided for sampling along a second set of parallel lines extending in a second direction in k-space, where the second direction is orthogonal to the first direction. In the example, the first mask 202a is a YZ mask for sampling in the X direction, and the second mask 202b is an XZ mask for sampling in the Y direction, as shown in FIG. 3C. Because the MR data are sampled in two orthogonal directions with different points in each mask, there is less correlation in the resulting dataset. This means greater information efficiency in the sampled data, and less data redundancy.

The number of sampling points in each of the two sampling masks 202a, 202b is selected to achieve a desired acceleration. For example, if an overall acceleration factor of 10 is desired for the 2D scanning method, the individual scans in each orthogonal direction are performed twice as fast as a single (1D) undersampling scan with an acceleration factor of 10 Each individual sampling mask 202a, 202b has the same number of points that would be used in a 1D sampling mask with an acceleration factor of 20. (Each of the orthogonal scans is performed twice as fast.) Compared to a 1D scanning method, this 2D sampling has approximately the same total sampling and reconstruction time, but improved image quality, with a reduction of blurring in two directions. The 2D sampled data have less coherence (i.e., less redundant information) than data sampled with 1D scanning as shown in FIG. 2C.

In some embodiments, a first set of sampling points in the first mask 202a is different from the second set of sampling points on the second mask 202b. In the case where the first and second sets of sampling points are different from each other, there is less correlation in the data than in the case where the Y coordinate of each point in the YZ mask 202a matches the X coordinate of a corresponding point in the XZ mask 202b.

As shown in FIG. 3C, a first set of magnetic resonance (MR) k-space data using are sampling using the MR scanner 100 by scanning a subject in the first (e.g., X) direction using the first (e.g., YZ) sampling mask, and a second set of MR k-space data is sampled using the MR scanner 100 by scanning the subject in the second direction using the second sampling mask. and For example, in some embodiments, the points on each sampling mask 202a, 202b are generated randomly according to a single variable density distribution. In other embodiments, the points on each sampling mask 202a, 202b are generated randomly according to respectively different variable density distributions. By randomly generating the points in each of the two masks 202a, 202b, the data sampled during the X sampling have little correlation with the data sampled in the Y sampling.

Figure 4:
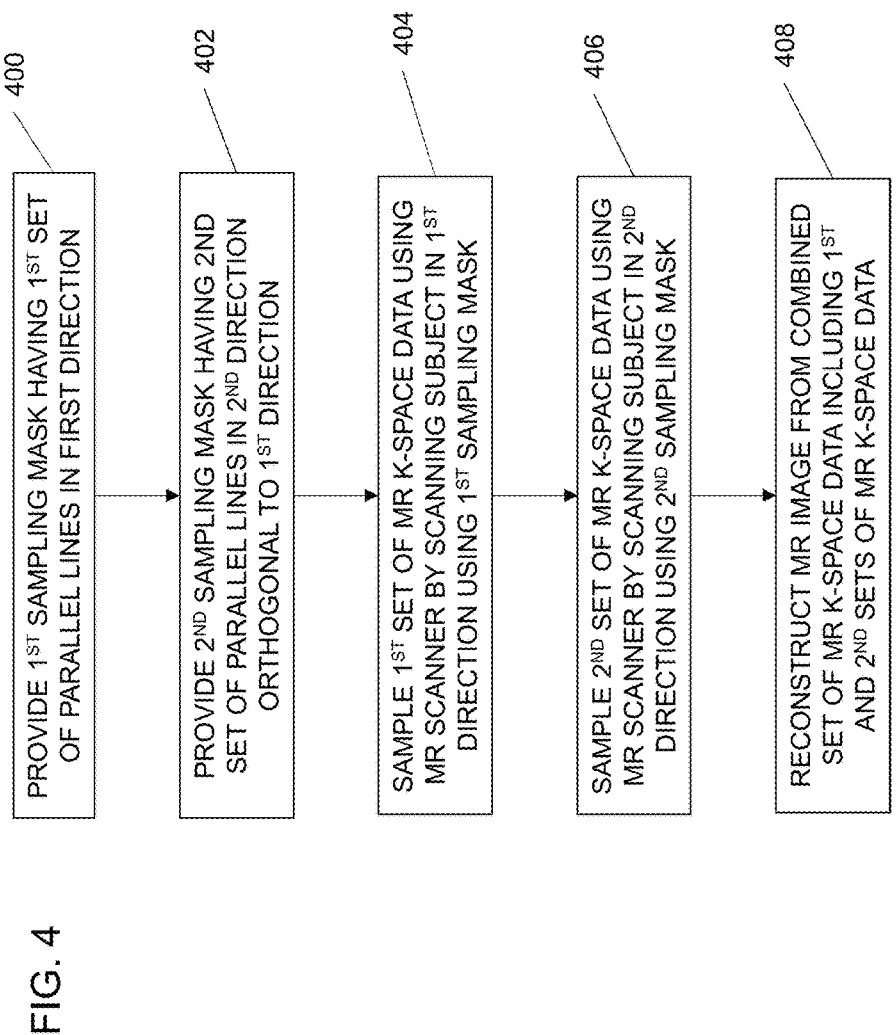
FIG. 4 is a flow chart of a method of acquiring and reconstructing an MR image using the 2D sampling method of FIG. 3C.

FIG. 4 is a flow chart of an MR imaging method using an embodiment of the 2D sampling as described above.

At step 400, a first sampling mask 202a is provided for sampling along a first set of parallel lines extending in a first direction (e.g., X) in k-space.

At step 402, a second sampling mask 202b is provided for sampling along a second set of parallel lines extending in a second direction (e.g., Y) in k-space, where the second direction is orthogonal to the first direction.

At step 404, a first set of magnetic resonance (MR) k-space data is sampled using an MR scanner 100 by scanning a subject 11 in the first direction using the first sampling mask.

At step 406, sampling a second set of MR k-space data using the MR scanner 100 by scanning the subject 11 in the second direction using the second sampling mask.

At step 408, the central control unit 26 of the MR system 100 reconstructs an MR image from a combined set of MR k-space data including the first set of MR k-space data and the second set of MR k-space data. The data corresponding to the two scanning directions can be processed using the same reconstruction algorithms that are used for data sampled with 1D scanning. Examples of reconstruction techniques that can be applied include, but are not limited to, those described in U.S. Patent Application Publication Nos. US2016/0146915A1, US2016/0247263A1, and US2016/0178720A1, which are incorporated by reference herein in their entireties. The 2D sampled data have reduced data isotropy.

2D Sampling with Partitioning

In some embodiments, a greater degree of incoherency can be achieved using a mask partitioning method. In general, the sampling method with partitioning includes the following steps, in which D is a dimension.

a) Designing a 2D sampling mask as a set of points in a plane (D,Z)

b) Partition the possible Z coordinates into two disjoint sets Z1 and Z2 c) Partition the 2D mask into two masks (D1,Z1) and (D2,Z2) following the partition of the Z coordinates d) For the first direction, set D=X and define the mask as the set of all lines along Y with coordinates (X=D1, Z1)

e) For the second direction, set D=Y and define the mask as the set of all lines along X with coordinates (Y=D2, Z2)

FIGS. 3A and 3B show an example of two masks that can be obtained by a partitioning method. The partitioning method is explained schematically in FIGS. 5A-5C.

Figure 5B:
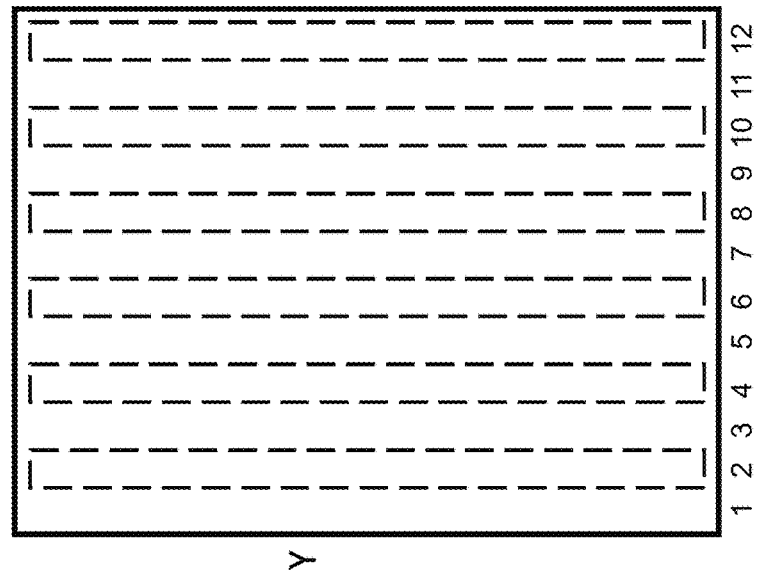
FIGS. 5A-5C are schematic representations of partitioning by striping the sampling points in the Z dimension to eliminate redundancy in 2D information sampled.
Figure 5A:
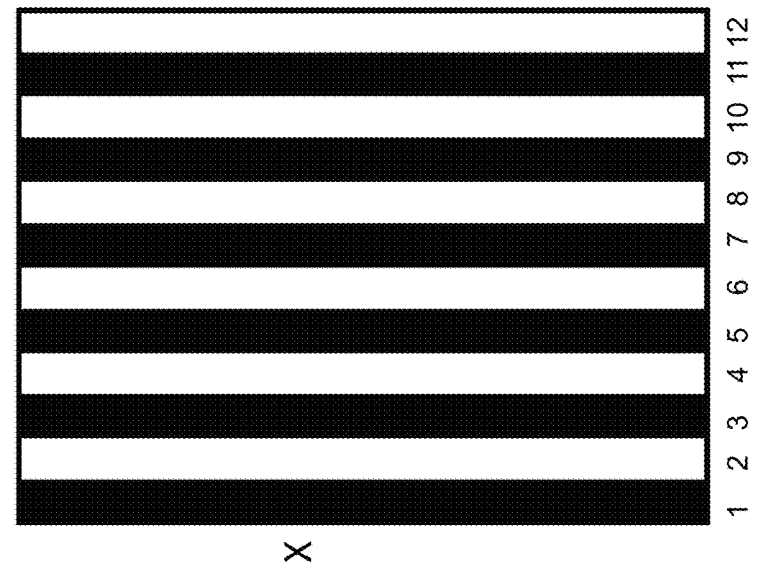

In FIGS. 5A and 5B, an area representing a 2D sampling mask is divided into a plurality of rows or columns (also referred to herein as stripes). In this example, the area is divided into 12 columns, numbered 1-12, but any number of columns can be used. In FIG. 5A, the odd numbered columns (stripes) 1, 3, 5, 7, 9 and 11 are all assigned to a first partition and shaded black. In FIG. 5B, the even numbered columns 2, 4, 6, 8, 10 and 12 are all assigned to a second partition and shaded white. Note that in both FIGS. 5A and 5B, the horizontal axis is labeled "Z", but the vertical axis is labeled differently in each of these figures. In FIG. 5A, the vertical axis is labeled "X" and in FIG. 5B, the vertical axis is labeled "Y".

Figure 5C:
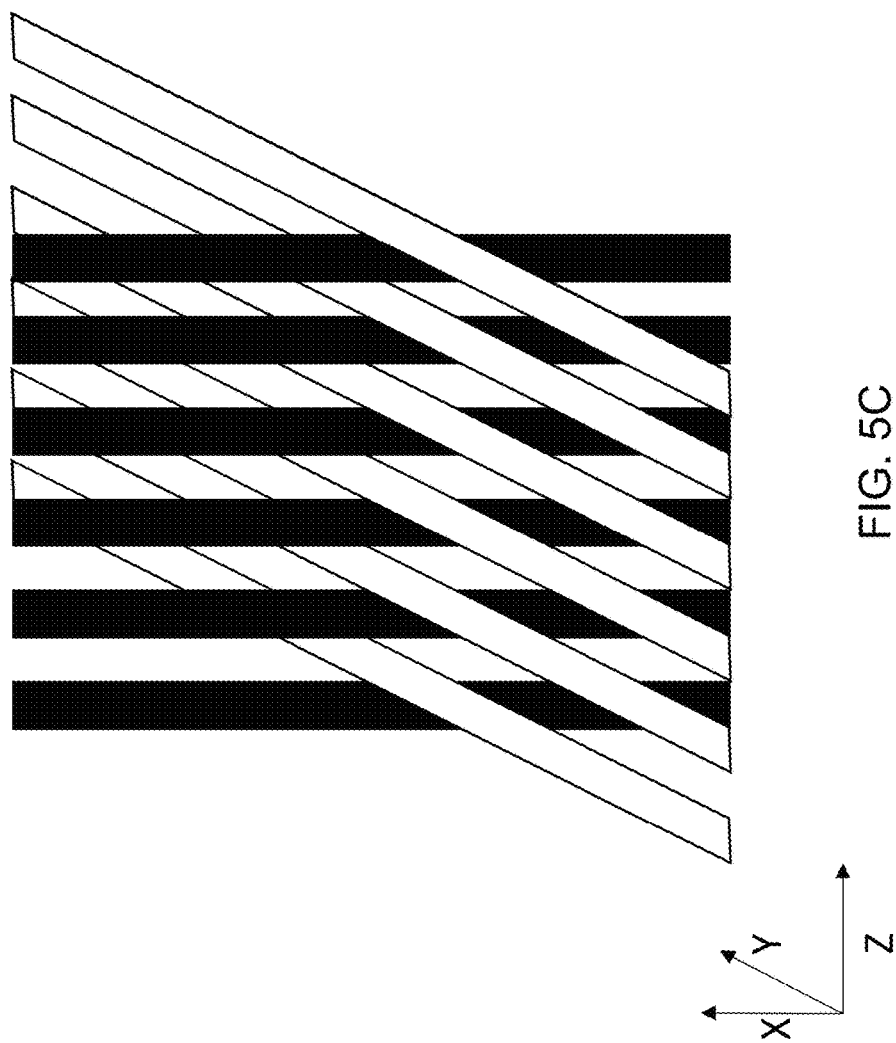

If these two sets of columns (stripes) in FIGS. 5A and 5B are overlaid in a single plane, none of the odd numbered columns of the first partition would intersect or overlap any of the even numbered columns of the second partition, because the sets of columns in each partition are disjoint from each other. If the even numbered columns in the second partition are overlaid with the odd numbered columns of the first partition, and then rotated 90 degrees about the Z axis into the YZ plane, as shown in FIG. 5C, the same condition still exists: none of the odd numbered columns of the first partition intersect or overlap any of the even numbered columns of the second partition, because the sets of columns in each partition are disjoint from each other.

According to some embodiments of this disclosure, the sampling points of a 2D sampling mask can be partitioned in a similar manner to that shown in FIGS. 5A and 5B. A variety of methods can be used to assign the sampling points to the two partitions.

As an initial partitioning step, the Z domain can be divided into an even number of equally sized columns (stripes), with odd numbered columns assigned to one of the partitions and even numbered stripes assigned to the other partition. Then each sampling point in the sampling mask can be assigned to the partition having one of the stripes of the Z domain containing that sampling point. (Thus, if two sampling points have the same Z value, they are assigned to the same partition as each other).

Referring again to FIGS. 2A, 3A and 3B, the same partitioning approach can be applied to partition the sampling mask 200 of FIG. 2A into two sampling masks 202a and 202b as shown in FIGS. 3A and 3B. The area of the sampling mask 200 is divided into a plurality of stripes (columns or rows). The sampling points in the mask 200 of FIG. 2A that overlie the odd numbered stripes are assigned to the first partition, and the sampling points in the mask 200 of FIG. 2A that overlie the even numbered stripes are assigned to the second partition. In each of the masks 202a, 202b, the empty columns (stripes) correspond to Z values assigned to the opposite mask.

Any number of rows or columns (stripes) per partition can be used. A large number of rows or columns (e.g., 100 or more rows or columns) per partition distributes the sampling points so that each of the partitions has a distribution function approximating the distribution of the original sampling mask. For example, each of the masks 202a (FIG. 3A) and 202b (FIG. 3B) has a large number of thin columns of sampling points with a variable density distribution function similar to the distribution of the original sampling mask in FIG. 2A. Upon close inspection, each mask has a large number of white columns (stripes) corresponding to Z values assigned to the opposite partition (i.e., the other sampling mask).

In some embodiments, fine adjustments are made to the partitioning assignments. In some embodiments, the system determines the number of unique Z values among the sampling points, and moves stripe boundaries to reassign sampling points between partitions, so that each partition has the same (or approximately the same) number of unique Z values. For example, the processor can determine how many Z values are in each partition, and change the assignments of some of the points from one partition to another partition. (Because the number of Z values per partition is equalized, the actual number of sampling points per partition may differ, if multiple sampling points have the same Z value.)

In some embodiments, the sampling points can be assigned in the following manner to provide approximately the same number of unique Z values in each of the partitions. The sampling points of the 2D sampling mask are sorted by unique Z value, so that all sampling points having a common Z value are grouped together in the same subset. The subsets (sorted in order of unique Z value) are then split between the partitions. For example, the odd numbered unique Z valued sampling points are assigned to the first partition, and the even numbered unique Z valued sampling points are assigned to the second partition. This method essentially uses the striping method, such that each stripe has a single Z value. By this method, each partition has approximately the same number of unique Z values, and the distribution functions of the sampling points in each partition will be similar.

In some embodiments, to maintain the variable density sampling distribution, the processor determines which sampling points have Z values closest to the edge of one of the columns (stripes), and a boundary between two of the columns (stripes) is moved beyond one or more sampling points, until each partition has the same number of Z values.

Whichever partitioning method is used, by partitioning the Z values of all of the sampling points into two separate sampling masks with disjoint sets of Z values, the method can guarantee that no pair of orthogonal scan lines used during the 2D scanning will intersect. This improves the incoherency of the sampled data, so that blurring in the reconstructed image is reduced in two orthogonal directions. A given number of samples will have more unique information, and less redundant information.

Figure 6:
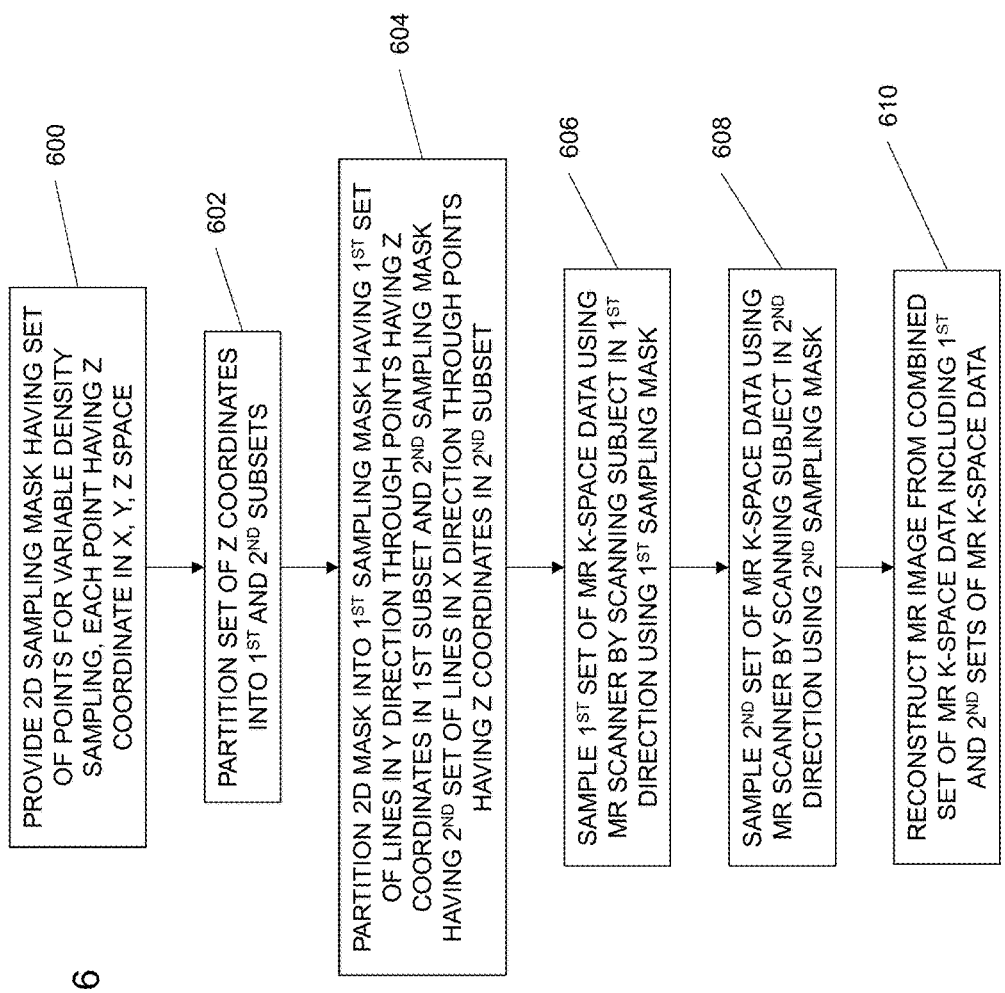
FIG. 6 is a flow chart of a method of 2D scanning with sampling mask partitioning.
Figure 7D:
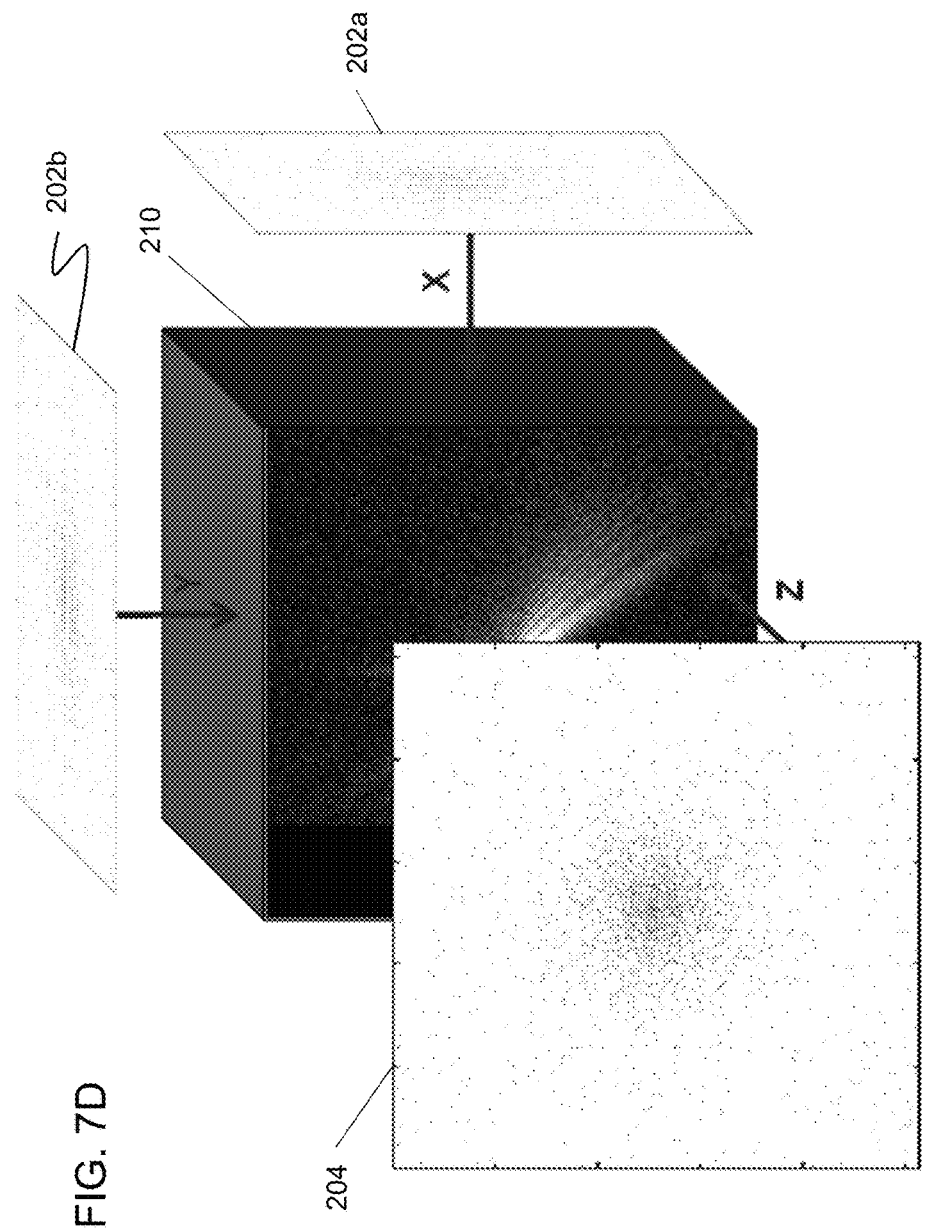
FIG. 7D is a schematic showing the sampling masks of FIGS. 7A-7C used to sample MR k-space data while scanning a subject in the X, Y, and Z directions, respectively.

FIG. 6 is a flow chart of a method for 2D magnetic resonance imaging, including partitioning the sampling points in a sampling mask to provide two disjoint sampling masks.

At step 600, a two-dimensional (2D) sampling mask having a set of points is provided. Each point has a respective Z coordinate in a space having orthogonal directions X, Y and Z.

At step 602, a set containing the Z coordinates in the set of points is partitioned into first and second disjoint subsets, using one of the partitioning methods described above, or a another partitioning method that results in the desired variable sampling point density function in the unique Z values in each of the resulting partitions.

At step 604, the 2D mask is partitioned into a first sampling mask for sampling along a first set of lines extending in the Y direction through points with Z coordinates in the first subset, and a second sampling mask having points for sampling along a second set of lines extending in the X direction through points with Z coordinates in the second subset.

At step 606, a first set of magnetic resonance (MR) k-space data is sampled using an MR scanner 100 by scanning a subject in the X direction using the first sampling mask.

At step 608, a second set of MR k-space data is sampled using the MR scanner 100 by scanning the subject in the Y direction using the second sampling mask.

At step 610, an MR image is reconstructed from a combined set of MR k-space data including the first set of MR k-space data and the second set of MR k-space data.

3D Sampling

Figure 8:
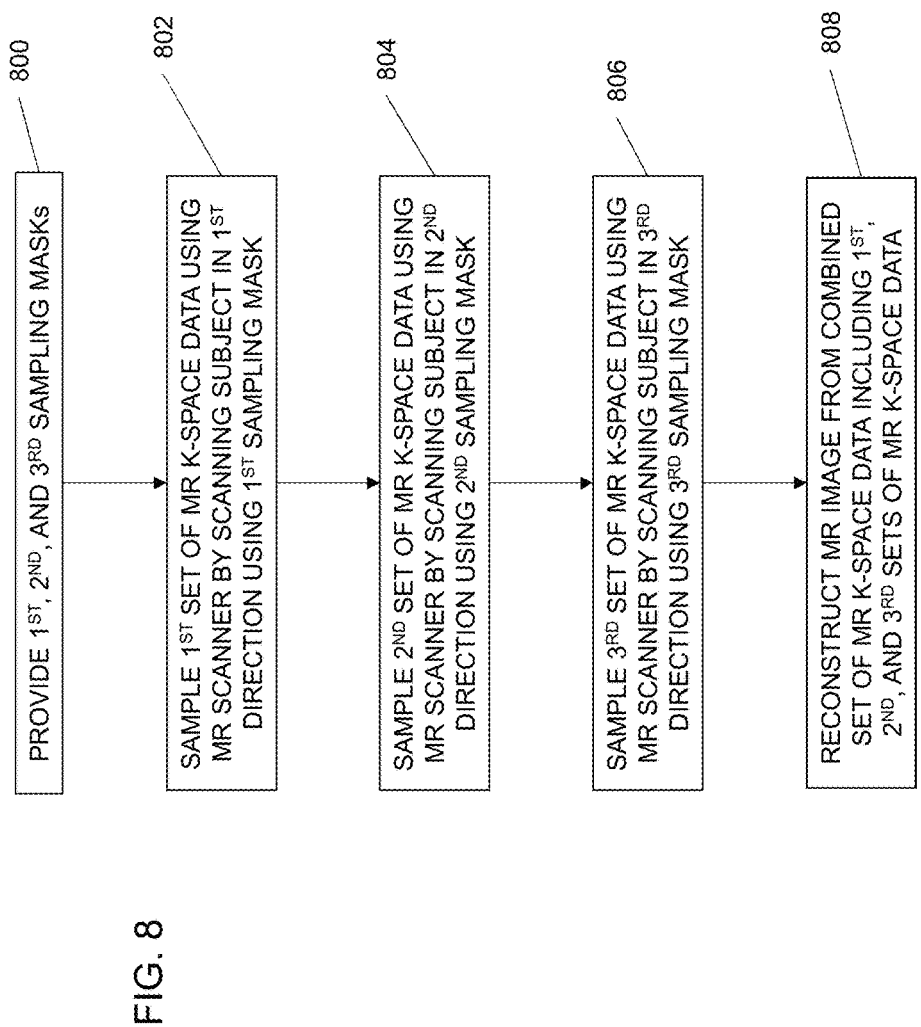
FIG. 8 is a flow chart of a method of 3D scanning method according to some embodiments.

FIGS. 7A-7D show a method for 3D sampling, and FIG. 8 is a flow chart of an exemplary method. The MR scanner 100 scans the subject in three orthogonal directions. 3D sampling can improve image quality by reducing blurring in three directions.

At step 800, a first sampling mask 202a, a second sampling mask 202b and a third sampling mask 204 are provided. FIGS. 7A and 7B show a pair of masks 202a, 202b that can be used for scanning in the first two directions, and FIG. 7C shows an additional sampling mask 204 for scanning the subject in a third direction orthogonal to the first direction and the second direction.

At step 802, a first set of k-space data is sampled using the MR scanner 100 by scanning the subject in the first direction using the first sampling mask 202a.

At step 804, a second set of k-space data is sampled using the MR scanner 100 by scanning the subject in the second direction using the first sampling mask 202b.

At step 806, a third set of k-space data is sampled using the MR scanner 100 by scanning the subject in the third direction using the third sampling mask 204. Thus, in addition to the scans performed in FIG. 4 or FIG. 6, a third set of MR k-space data is acquired with the MR scanner 100 by scanning the subject in a third direction using the third mask 204, where the third direction (Z) is orthogonal to the first direction (X) and the second direction (Y).

At step 808, the data corresponding to the three scanning directions are processed using the same reconstruction algorithms that are used for data sampled with 1D scanning. The 3D sampled data have reduced data isotropy. The combined set of MR k-space data includes the first set of MR k-space data (e.g., from scanning in the X direction), the second set of k-space data (e.g., from scanning in the X direction), and a third set of MR k-space data (e.g., from scanning in the Z direction).

Figure 9:
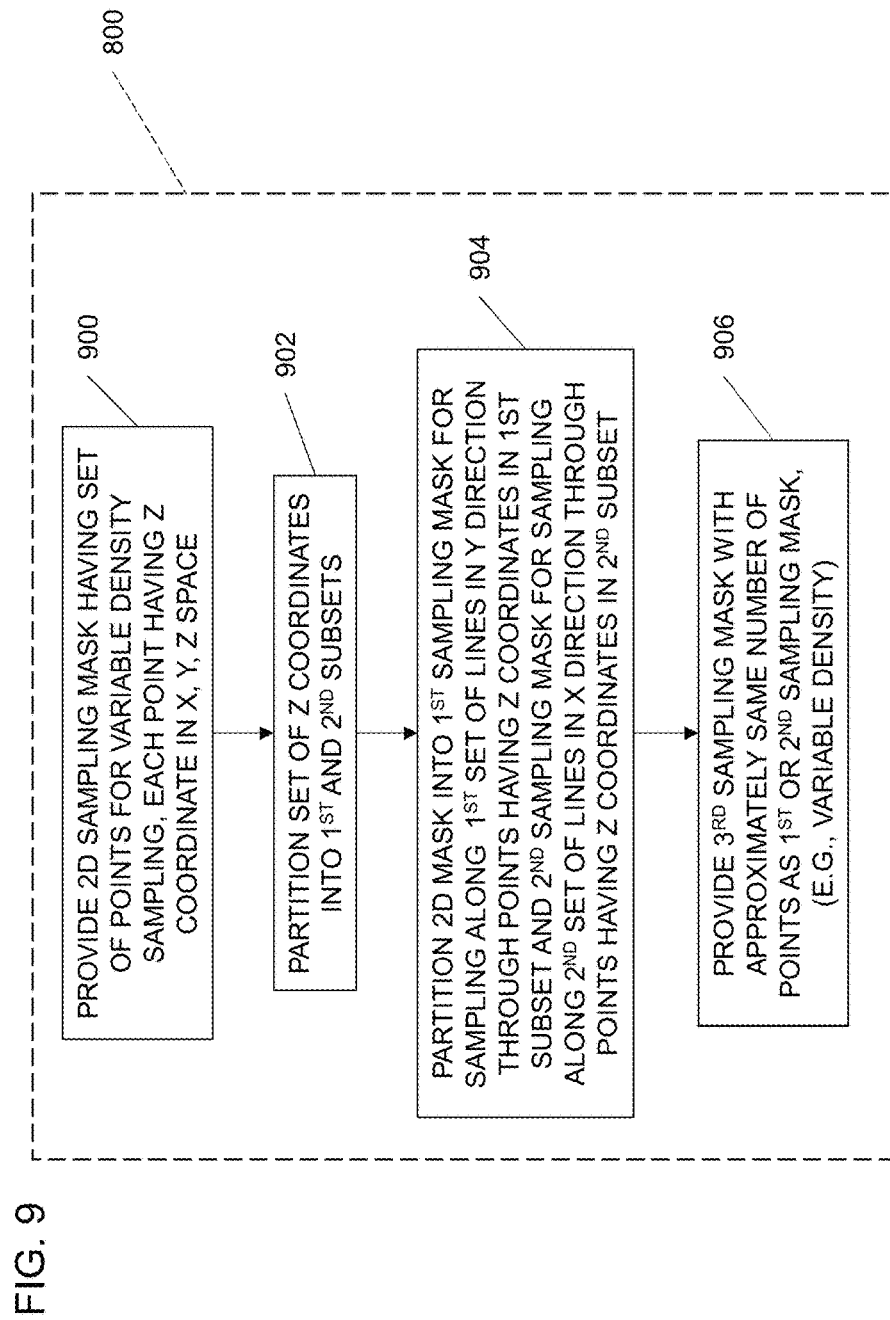
FIG. 9 is a flow chart of an embodiment of the sampling mask generation step of FIG. 8.

FIG. 9 shows a first example of the step 800 for providing the first sampling mask 202a, a second sampling mask 202b and a third sampling mask 204.

At step 900 a 2D sampling mask (e.g., mask 200 of FIG. 2A is provided. The mask 200 has a set of sampling points for variable density sampling. Each point has coordinates in the X, Y, Z space.

At step 902, the set of Z coordinates of the sampling mask is partitioned into first and second subsets.

At step 904, the 2D sampling mask is partitioned into a first sampling mask 202a for sampling along a first set of lines in the Y direction, through points having Z coordinates in the first subset, and a second sampling mask 202b for sampling along a second set of lines in the X direction, through points having Z coordinates in the second subset. For example, the first sampling mask 202a and the second sampling mask 202b can be the same sampling masks discussed above. In some embodiments, the masks 202a, 202b can be generated using any of the methods described above for 2D sampling. For example, masks 202a, 202b can be generated by partitioning a sampling mask into two subsets of sampling points, as described above with respect to FIGS. 3A to 6.

At step 906, for scanning in the third (Z) direction, a third mask is provided for sampling magnetic resonance (MR) k-space data. For example, in some embodiments, a random YX mask 204 (FIG. 7C) is generated according to a desired distribution (e.g., a variable density distribution). In some embodiments, each of the sampling masks 202a and 202b have the same number of unique Z values as each other, and the third sampling mask 204 has about the same number of sampling points as the number of unique Z values in the mask 202a or the mask 202b.

Potentially there can be some crossing between a Z readout line and an X readout line, or between a Z readout line and a Y readout line. Since the YZ sampling mask 202a is used to scan in the X direction, and the YX sampling mask 204 is used to scan in the Z direction, there is an intersection point between scan lines if any sampling point on the YX mask 204 has a Y coordinate that is the same as a Y coordinate of a point on the YZ mask 202a. Similarly, since the XZ mask is used to scan in the Y direction, and the YX mask 204 is used to scan in the Z direction, there is an intersection point between scan lines if any sampling point on the YX mask 204 has an X coordinate that is the same as a X coordinate of a point on the XZ mask 202b.

Nevertheless, a large percentage of the data will not be redundant, and the X and Y scanning lines never cross each other. As a result there is still an accelerated scan. Even with all lines scanned in the X, Y and Z directions taken together there are still many holes in k-space (zeroes in the data cube), so that scanning time and reconstruction time are accelerated and the data dare desirably incoherent.

For 3D scanning, the total acceleration depends on the acceleration in each scanning direction. For example, to achieve an acceleration factor of 10 with 3D scanning, the individual scans in the X, Y and Z direction can be three times as fast a 1D scan in the same direction (i.e., an acceleration factor of 30 in each individual direction).

Figure 10:
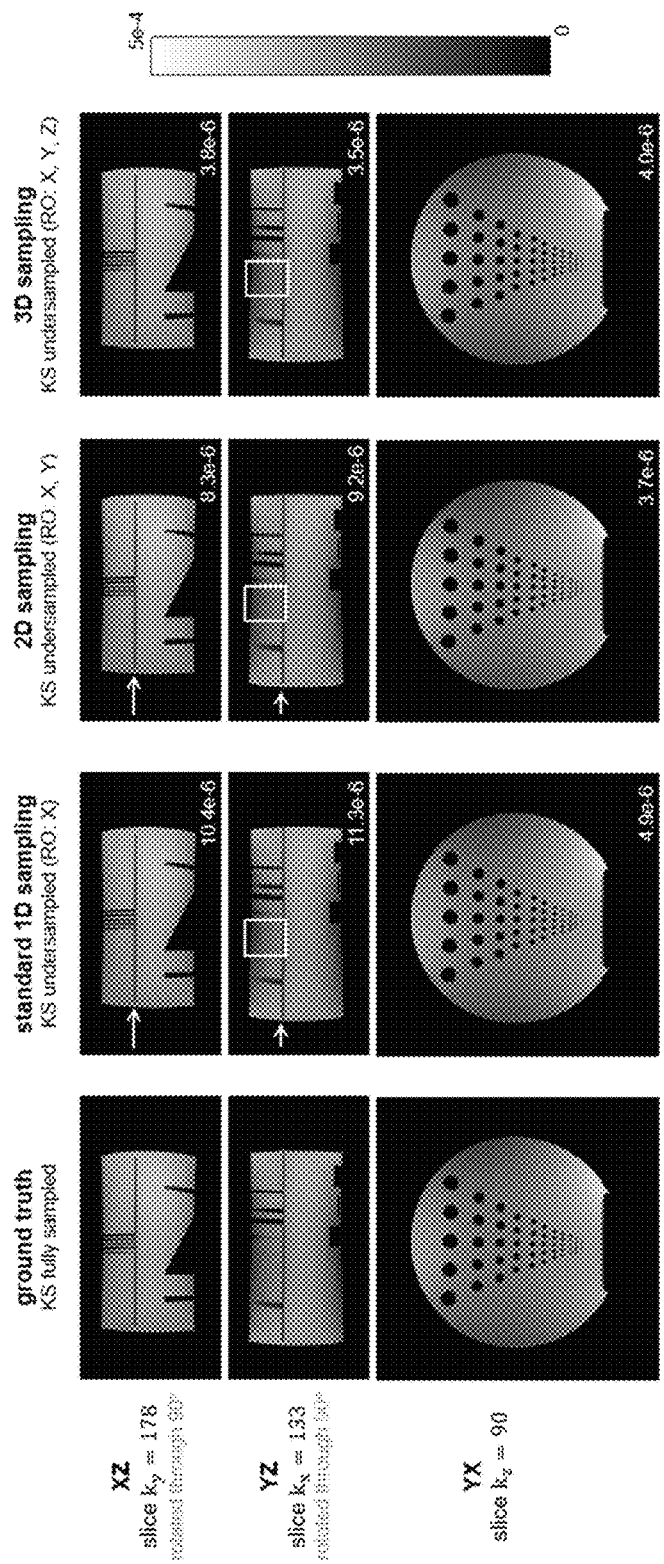
FIG. 10 compares images reconstructed from the same image phantoms with full sampling and three undersampling techniques.

FIG. 10 shows a comparison of images reconstructed from the same standard phantom MR signal data set. The first column shows the results of fully sampling the subject (i.e., without compressed sensing). The second column shows the same images reconstructed from undersampled data using a conventional 1D scan pass. The third column shows the same images undersampled with the 2D scanning method of FIGS. 3A-6, using the same acceleration factor as for the 1D sampling. The fourth column shows the same images undersampled with the 3D scanning method of FIGS. 7A-9, using the same acceleration factor as for the 1D sampling. All of the undersampled images (1D, 2D and 3D) have the same acceleration factor. In the undersampled 1D and 2D images (second, and third columns), slight blurring is most evident in the horizontal line indicated by an arrow. The blurring is greatest in the conventional 1D sampled image. The 2D sampled image has less blurring. There is very little blurring in the 3D image.

Figure 11:
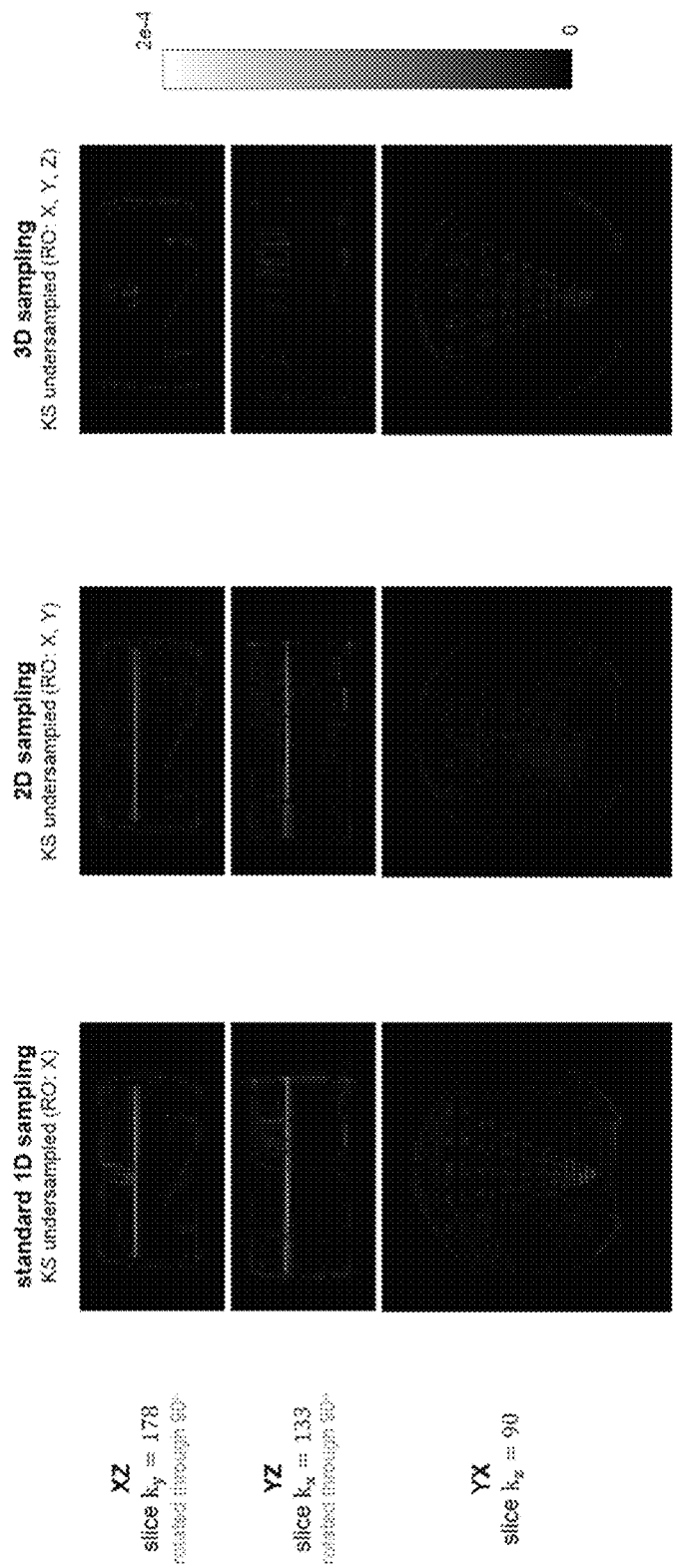
FIG. 11 compares difference images showing the errors in the undersampled images of FIG. 10.

FIG. 11 shows an enlarged detail of difference images in the region indicated by a rectangle in FIG. 10. The difference images show the difference in between the full sampling (column 1 of FIG. 10) and the three undersampled images. The first column in FIG. 11 shows the difference between the first and second columns in FIG. 10 (full sampling vs. 1D undersampling). The second column in FIG. 11 shows the difference between the first and third columns in FIG. 10 (full sampling vs. 2D undersampling). The third column in FIG. 11 shows the difference between the first and fourth columns in FIG. 10 (full sampling vs. 3D undersampling). The largest difference is in the blurred horizontal line of the 1D sampled image. The difference image for the 3D sampled image has substantially no visible difference.

Figure 12:
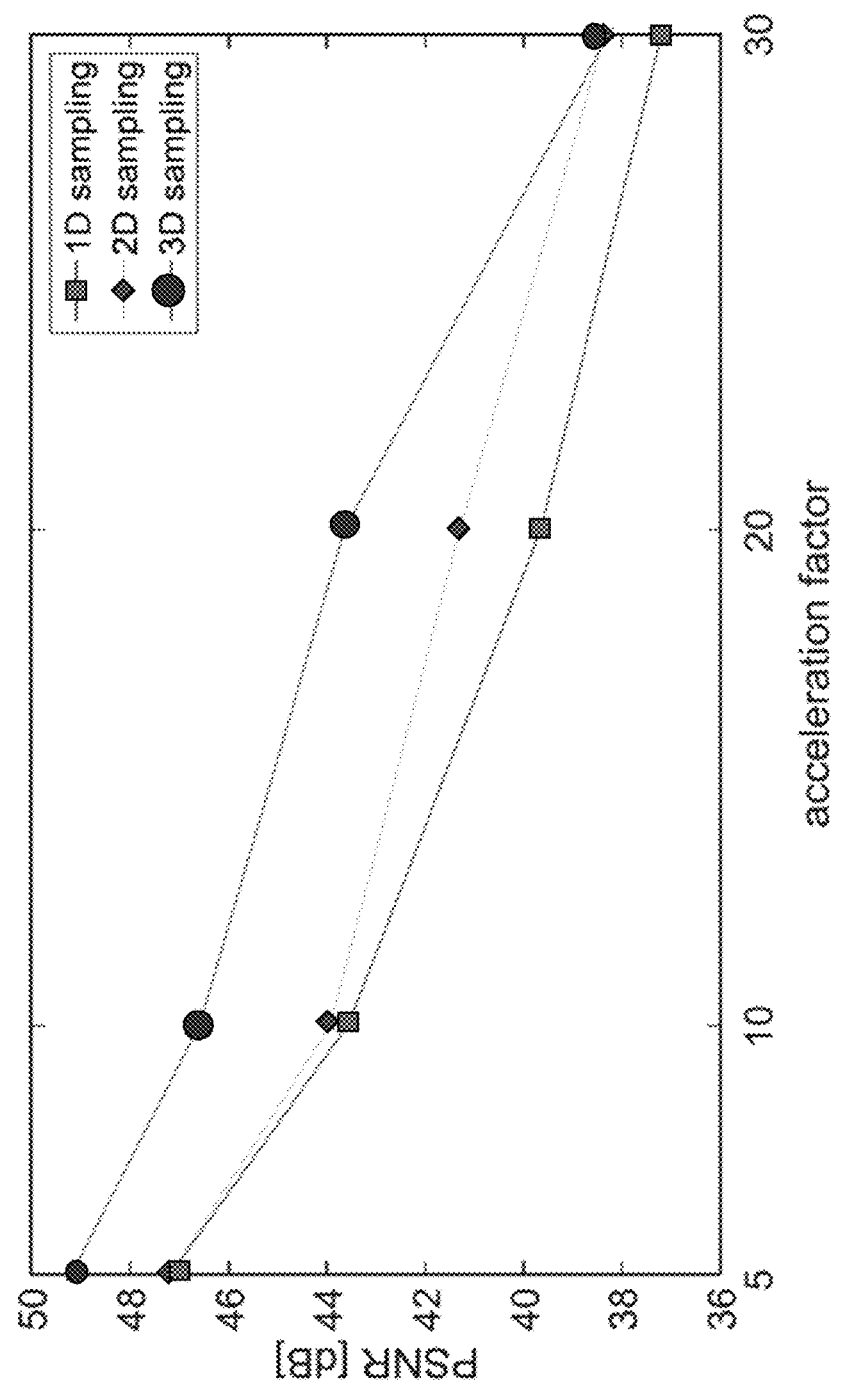
FIG. 12 is a diagram comparing peak signal to noise ration versus acceleration factor for three sampling techniques.

FIG. 12 shows a comparison of peak signal to noise ratio (PSNR) for images with 1D, 2D and 3D sampling for acceleration factors of 10, 20 and 30. The 3D sampled images show consistent increase in PSNR relative to the 1D sampling. The 2D sampling shows a significant improvement over 1D sampling with an acceleration factor of 20 and 30.

3D Low Resolution Sampling

Figure 13:
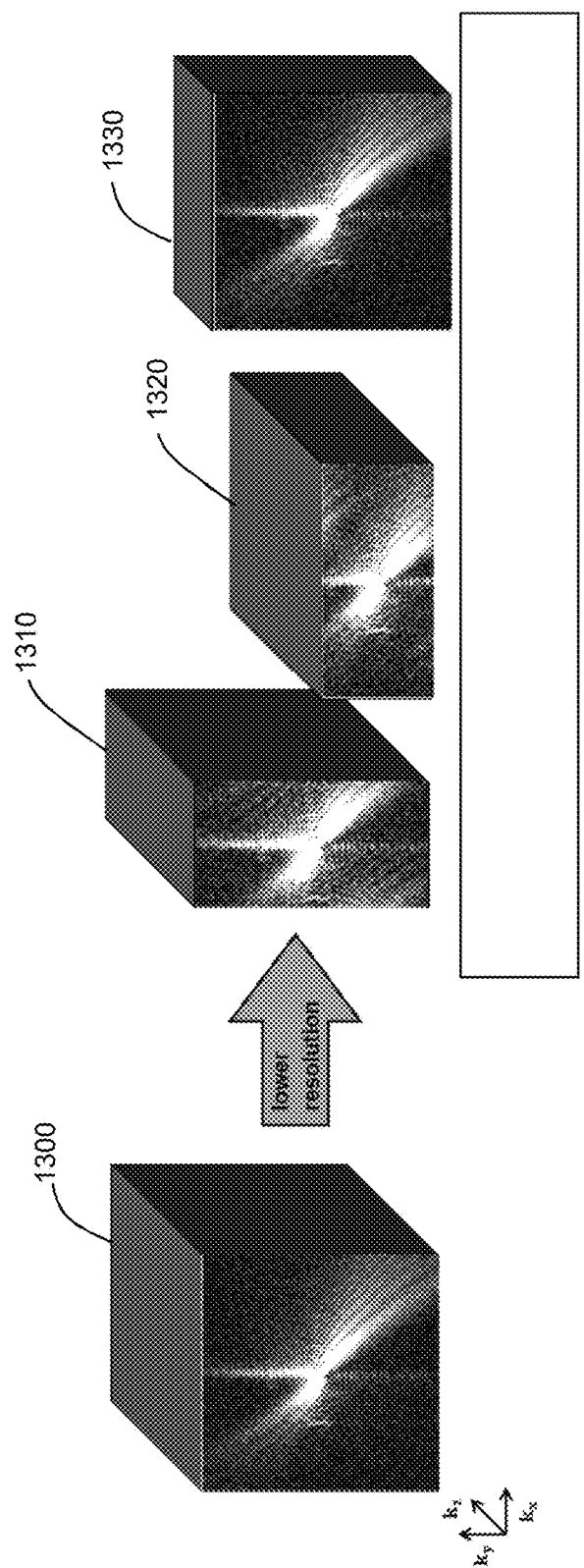
FIG. 13 is a schematic diagram for a 3D undersampling method according to some embodiments.
Figure 14:
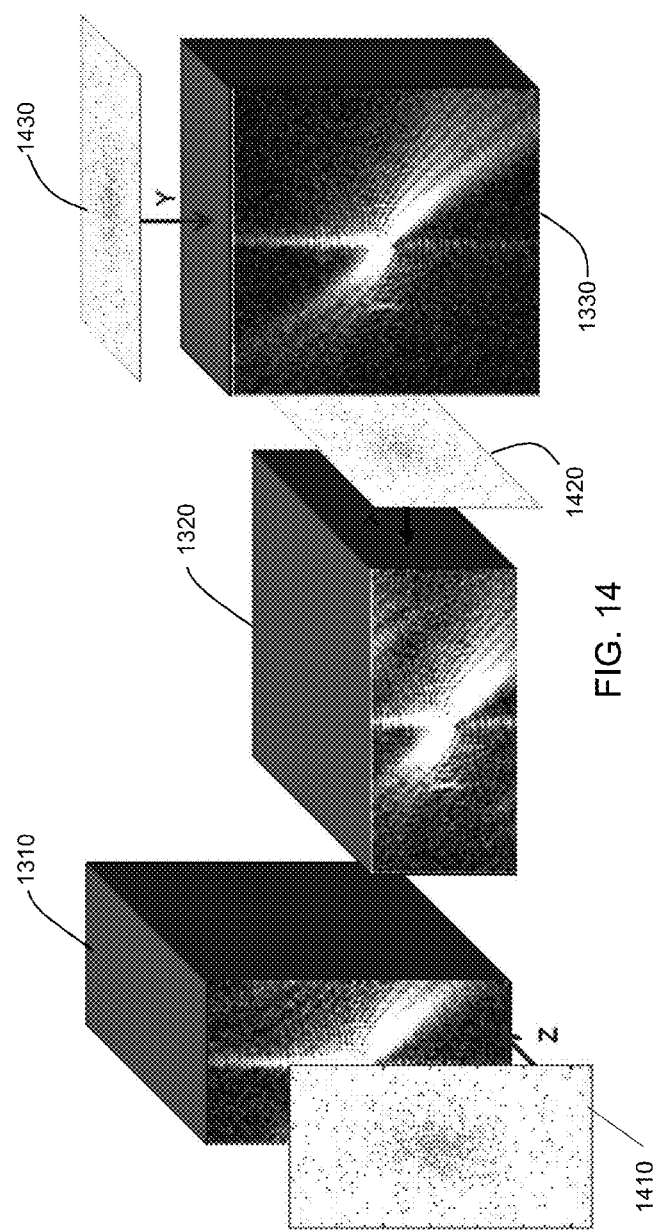
FIG. 14 is a schematic showing at least one sampling mask used to undersample MR k-space data while scanning a subject in the X, Y, and Z directions, respectively.
Figure 15:
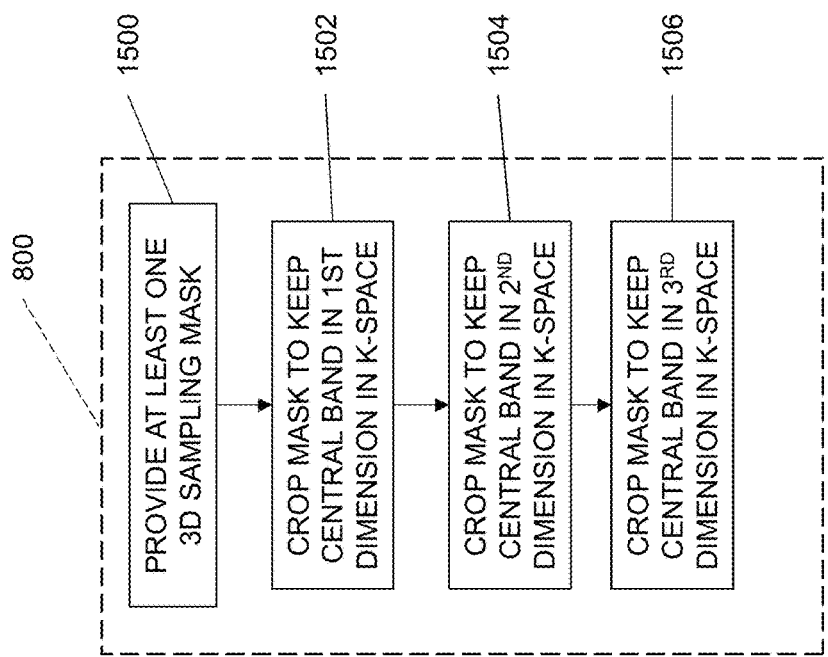
FIG. 15 is a flow chart of an embodiment of a sampling mask generation step of FIG. 8 for generating the masks used in FIG. 14.

FIGS. 13-15 show a schematic representation of another technique for 3D scanning according to some embodiments. The full k-space data cube 1300 is represented on the left, including frequency data for an MR image. In this example, the fully sampled data array is a 256×256×256 sample array. As shown by the luminance in the cube, most of the frequencies with significant non-zero coefficients are close to the center of the cube (lower frequency components), and most of the coefficients near the edges and corners of the cube are zeros (high frequency components).

According to the embodiment of FIGS. 13-15, in each scan direction (X, Y, Z), the sampling crops high frequencies. The 3D patterns are arranged so, for each orientation, the MR scanner 100 only acquires the central band of measurements, corresponding to the lower frequencies. As shown in FIG. 13, the central band in each direction contains the most information, so this band is sampled in each direction. Even though undersampling is used in each direction, scanning in three directions reduces blurring in each direction to achieve improved overall quality. For example, in some embodiments, the data 1300 are undersampled so that the X-direction scan acquires 64×128×128 samples of data, the Y-direction scan acquires 128×64×128 samples of data, and the Z direction scan acquires 128×128×64 samples of data. Thus, the total fraction of samples is 3/16× the full data array, providing a total acceleration factor of about 5.

FIG. 14 schematically shows the 3D sampling masks, and FIG. 15 is a flow chart of an embodiment of a method for generating the three sampling masks.

At step 1500, a 3D sampling mask is generated using a variable density sampling distribution, as discussed above. Three individual sampling masks can be generated from this one mask.

At step 1502, the sampling mask is cropped on two sides, keeping the central band (corresponding to lower frequency components) in a first dimension in k-space, to form a first direction sampling mask.

At step 1504, the sampling mask is cropped on the remaining two other sides, keeping the central band (corresponding to lower frequency components) in a second dimension in k-space to form a second direction sampling mask.

At step 1506, the sampling mask is cropped on either pair of two opposite sides, keeping the central band (corresponding to lower frequency components) in a third dimension in k-space to form a third direction sampling mask.

Once the three sampling masks are provided, the MR scanner 100 performs the sampling, as described above with reference to FIG. 8.

For example, in the case of the sampling masks 1410, 1420, and 1430 of FIG. 14, to generate the Z direction sampling mask, the 3D sampling mask is cropped at both sides in the X direction for form sampling mask 1410. Even if this sampling mask 1410 has the same sampling density function as the sampling mask 202a of FIG. 2A, it appears very different, because mask 1410 has a higher density of sampling points at the +X and −X edges than mask 202a. This is a result of cropping the low density regions from mask 1410. The X-direction sampling mask 1420 can start with the same 3D sampling mask, but the mask is cropped on the +Y and −Y sides. In other embodiments, the mask 1410 is rotated 90 degrees about the X axis and 90 degrees about the Z axis to provide mask 1420. In some embodiments, the Y-direction sampling mask 1430 can start with the same 3D sampling mask, but the mask is cropped either on the +X and −X sides or on the +Y and −Y sides and rotated 90 degrees about the X axis to provide mask 1430. In some embodiments, to reduce coherence, each mask is created separately, by randomly generating a sampling mask according to the variable density sampling distribution, and cropping the appropriate sides of each sampling mask 1410, 1420 and 1430.

Figure 16:
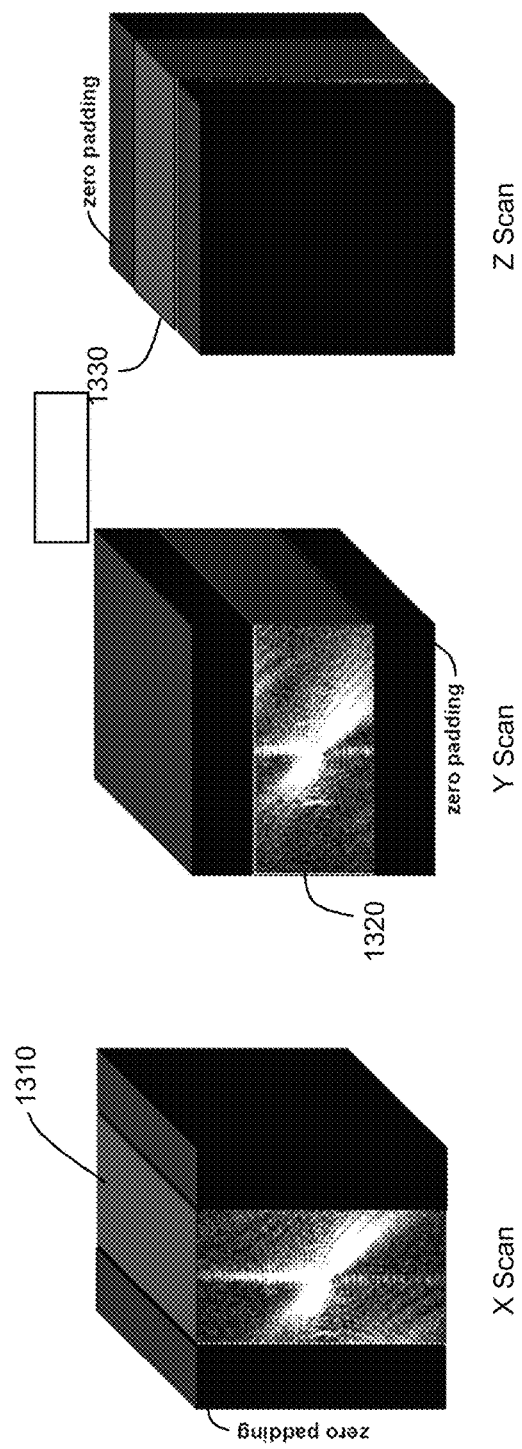
FIG. 16 is a schematic diagram of the MR k-space data collected in the 3D undersampling method of claim 14.

FIG. 16 schematically shows the acquired data for each scan. The data in the center band (corresponding to the lower frequencies) are acquired in each scan and stored in a non-transitory computer readable storage medium, and all the high frequency coefficients are set to zero. The frequency data cube is essentially padded with zeroes on two outer sides in each direction.

The image is reconstructed using the same methods discussed above. The k-space data array (cube) has many zeroes on all sides corresponding to high frequencies.

Figure 17:
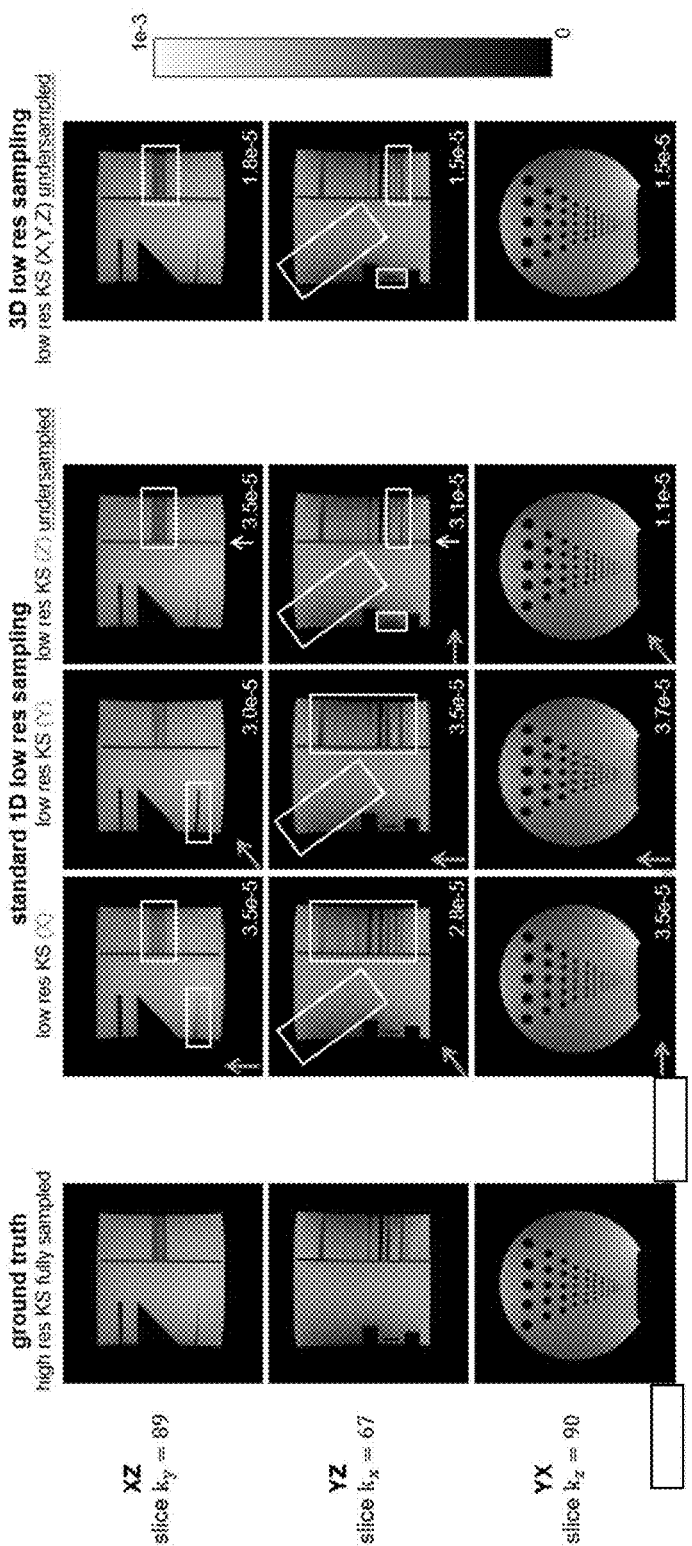
FIG. 17 compares images reconstructed from the same image phantoms with full sampling and four undersampling techniques.

FIG. 17 shows a comparison of images reconstructed from the same standard phantom MR signal data set used for reconstructing the images in FIG. 10. In FIG. 17, the first column shows the results of fully sampling the subject (i.e., without compressed sensing). The second column shows the same images reconstructed from undersampled data using a conventional 1D scan pass in the X direction. The third column shows the same images reconstructed from undersampled data using a conventional 1D scan pass in the Y direction, using the same acceleration factor as for the X direction 1D sampling. The fourth column shows the same images reconstructed from undersampled data using a conventional 1D scan pass in the Z direction, using the same acceleration factor as for the X and Y direction sampling. The fifth column is reconstructed from data sampled by the method of FIGS. 13-16. All of the undersampled images (1D, 2D and 3D) have the same acceleration factor. In the undersampled images (columns 2-5), slight blurring is occurs in the highlighted regions.

Figure 18:
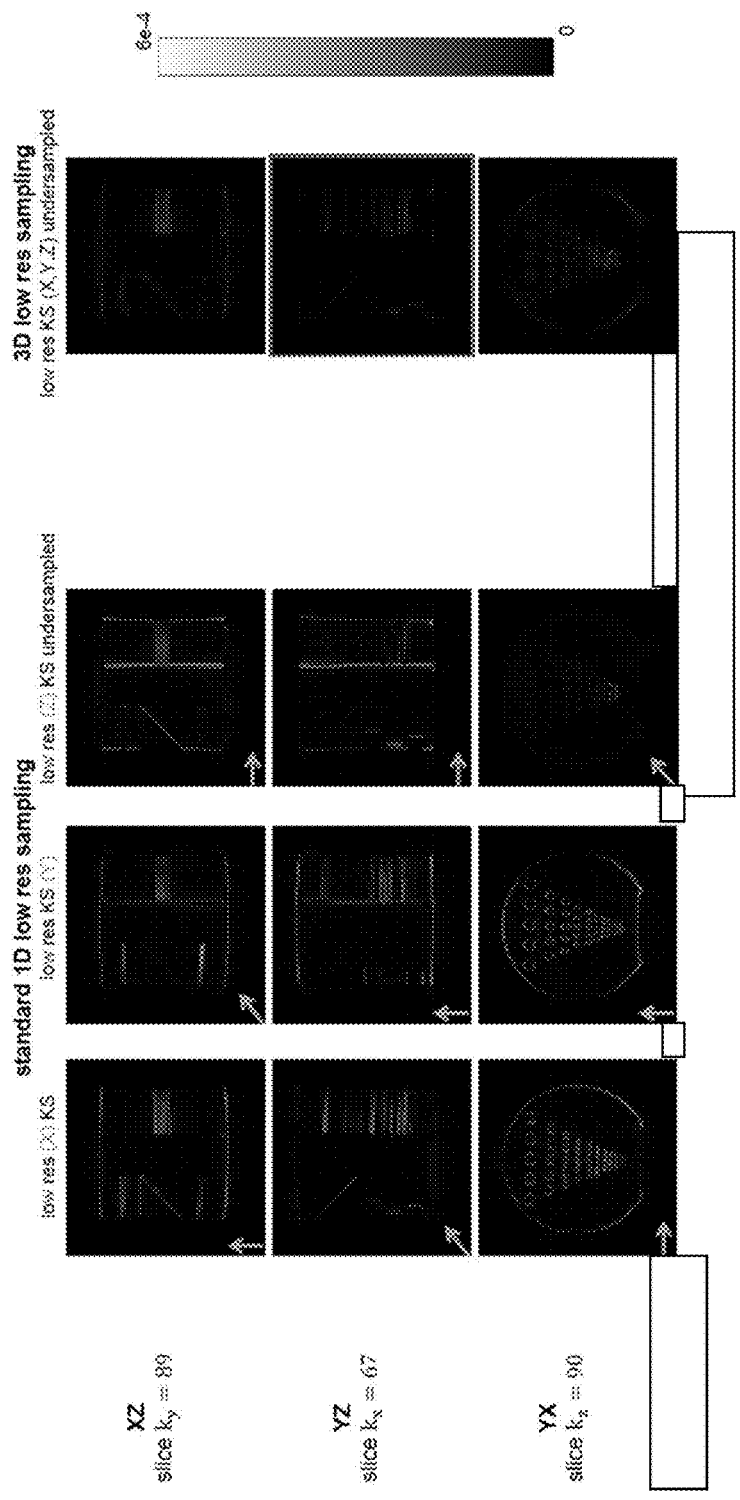
FIG. 18 compares difference images showing the errors in the undersampled images of FIG. 17.

FIG. 18 shows an enlarged details of difference images in the regions indicated by a rectangles in FIG. 17. The difference images show the difference in between the full sampling (column 1 of FIG. 17) and the four undersampled images. The first column in FIG. 11 shows the difference between the first and second columns in FIG. 16 (full sampling vs. 1D undersampling in the X direction). The second column in FIG. 11 shows the difference between the first and third columns in FIG. 16 (full sampling vs. 1D undersampling in the Y direction). The third column in FIG. 17 shows the difference between the first and fourth columns in FIG. 16 (full sampling vs. 1D undersampling in the Z direction). The fourth column in FIG. 17 shows the difference between the first and fifth columns in FIG. 16 (full sampling vs. 3D low resolution undersampling). All of the difference images in the first three columns show defects (The direction of the blurred lines differs in each column. The difference image for the 3D undersampled images (fourth column) has substantially less difference than any of the 1D sampling methods.

The example described above uses band-limited 3D sampling. For 2D sampling, band-limited sampling can be done in the directions that are not shared. For example, in the 2D sampling method described above with respect to FIGS. 3A-6, if the scanner acquires scan lines in the X direction and in the Y direction, one still acquires k-space data at high Z frequencies.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

Although the subject matter has been described in terms of exemplary embodiments, it is not limited thereto. Rather, the appended claims should be construed broadly, to include other variants and embodiments, which may be made by those skilled in the art.

What is claimed is:

1. A method for magnetic resonance imaging, comprising:
providing a first sampling mask for sampling along a first set of parallel lines extending in a first direction in k-space;
providing a second sampling mask for sampling along a second set of parallel lines extending in a second direction in k-space, where the second direction is orthogonal to the first direction;
sampling a first set of magnetic resonance (MR) k-space data using an MR scanner by scanning a subject in the first direction using the first sampling mask;
sampling a second set of MR k-space data using the MR scanner by scanning the subject in the second direction using the second sampling mask; and reconstructing an MR image from a combined set of MR k-space data including the first set of MR k-space data and the second set of MR k-space data, wherein none of the lines in the first mask intersect any of the lines in the second mask.

2. The method of claim 1, wherein a third direction is orthogonal to the first and second directions, and coordinates in the third direction for at least some of the lines in the second set of parallel lines are different from corresponding coordinates in the third direction for respective lines in the first set of parallel lines.

3. The method of claim 1, further comprising:
providing a third mask for sampling magnetic resonance (MR) k-space data; and
acquiring a third set of MR k-space data with the MR scanner by scanning the subject in a third direction using the third mask, where the third direction is orthogonal to the first direction and the second direction;
wherein the combined set of MR k-space data further includes the third set of MR k-space data.

4. The method of claim 3, wherein the first set of coordinates, the second set of coordinates, and a number of samples in the third mask have approximately a same number of elements.

5. The method of claim 3, wherein the third mask is arranged for variable density sampling.

6. A method for magnetic resonance imaging, comprising:
providing a two-dimensional (2D) sampling mask having a set of points, where each point has a respective Z coordinate in a space having orthogonal directions X, Y and Z;
partitioning a set containing the Z coordinates in the set of points into first and second disjoint subsets;
partitioning the 2D mask into a first sampling mask for sampling along a first set of lines extending in the Y direction through points with Z coordinates in the first subset, and a second sampling mask for sampling along a second set of lines extending in the X direction through points with Z coordinates in the second subset;
sampling a first set of magnetic resonance (MR) k-space data using an MR scanner by scanning a subject in the X direction using the first sampling mask;
sampling a second set of MR k-space data using the MR scanner by scanning the subject in the Y direction using the second sampling mask; and
reconstructing an MR image from a combined set of MR k-space data including the first set of MR k-space data and the second set of MR k-space data.

7. The method of claim 6, wherein a number of Z coordinates in the first subset is approximately equal to a number of Z coordinates in the second subset.

8. The method of claim 6, wherein the 2D sampling mask is arranged for variable density sampling.

9. The method of claim 6, wherein the 2D sampling mask is arranged to sample frequencies at a center of a Fourier plane with a greater density of k-space data than frequencies at an edge or corner of the Fourier plane.

10. The method of claim 6, wherein the 2D sampling mask is arranged to sample a first band of frequencies more densely than a second band of frequencies in the X and Y directions, wherein all of the frequencies in the second band of frequencies are higher than any of the frequencies in the first band of frequencies.

11. A method, comprising:
providing at least one sampling mask for sampling magnetic resonance (MR) k-space data, the sampling mask having three bands, including a center band of the three bands;
acquiring a first set of MR k-space data with an MR scanner by scanning a subject in a first direction to acquire data in the center band using a first one of the at least one mask;
acquiring a second set of MR k-space data with the MR scanner by scanning the subject in a second direction to acquire data in the center band using a second one of the at least one mask, the second direction orthogonal to the first direction;
acquiring a third set of MR k-space data with the MR scanner by scanning the subject in a third direction to acquire data in the center band using a third one of the at least one mask, the third direction orthogonal to the first direction and the second direction; and
reconstructing an MR image from a combined set of MR k-space data including the first set of MR k-space data, the second set of MR k-space data, and the third set of MR k-space data.

12. The method of claim 11, wherein the first set of MR k-space data, the second set of MR k-space data, and the third set of MR k-space data have approximately a same number of data.

13. The method of claim 11, wherein the sampling mask is arranged for variable density sampling.

14. The method of claim 11, wherein the sampling mask is arranged for sampling a first band of frequencies more densely than a second band of frequencies, wherein all of the frequencies in the second band of frequencies are higher than any of the frequencies in the first band of frequencies.

15. An MRI system, comprising:
a magnetic resonance (MR) scanner device having a plurality of coils, and configured to collect data representing an MR image from a subject;
a processor having a storage device for storing frequency components of the collected data, the processor programmed for:
acquiring a first set of MR k-space data using the MR scanner to scan the subject in a first direction using a first sampling mask, including sampling along a plurality of parallel lines extending in the first direction;
acquiring a second set of MR k-space data using the MR scanner to scan the subject in the a second direction using a second sampling mask, including sampling along a second plurality of lines extending in the second direction; and
reconstructing an MR image from a combined set of MR k-space data including the first set of MR k-space data and the second set of MR k-space data,
wherein the first sampling mask and the second sampling mask are arranged for variable density sampling.

16. The system of claim 15, wherein the first sampling mask and the second sampling mask have approximately equal number of sampling points.

17. The system of claim 15, wherein the first and second sampling masks cause the MR scanner to sample a first band of frequencies more densely than a second band of frequencies, wherein all of the frequencies in the second band of frequencies are higher than any of the frequencies in the first band of frequencies.

18. The system of claim 15, wherein the processor is further programmed for:
  acquiring a third set of MR k-space data by scanning the subject in a third direction using a third mask, where the third direction is orthogonal to the first direction and the second direction;
  wherein the combined set of MR k-space data further includes the third set of MR k-space data.

\* \* \* \* \*